United States Patent
Then et al.

(10) Patent No.: US 10,580,895 B2
(45) Date of Patent: Mar. 3, 2020

(54) WIDE BAND GAP TRANSISTORS ON NON-NATIVE SEMICONDUCTOR SUBSTRATES

(71) Applicant: Intel Corporation, Santa Clara, CA (US)

(72) Inventors: Han Wui Then, Portland, OR (US); Robert S. Chau, Beaverton, OR (US); Sansaptak Dasgupta, Hillsboro, OR (US); Marko Radosavljevic, Beaverton, OR (US); Benjamin Chu-Kung, Portland, OR (US); Seung Hoon Sung, Portland, OR (US); Sanaz Gardner, Portland, OR (US); Ravi Pillarisetty, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/040,505

(22) Filed: Jul. 19, 2018

(65) Prior Publication Data
US 2018/0331224 A1  Nov. 15, 2018

Related U.S. Application Data

(63) Continuation of application No. 15/499,794, filed on Apr. 27, 2017, now Pat. No. 10,032,911, which is a
(Continued)

(51) Int. Cl.
*H01L 29/78* (2006.01)
*H01L 29/06* (2006.01)
(Continued)

(52) U.S. Cl.
CPC ...... *H01L 29/7848* (2013.01); *H01L 21/0254* (2013.01); *H01L 21/02381* (2013.01);
(Continued)

(58) Field of Classification Search
CPC .......................... H01L 29/2003; H01L 29/78
See application file for complete search history.

(56) References Cited

U.S. PATENT DOCUMENTS

| | | | |
|---|---|---|---|
| 10,205,005 B1 * | 2/2019 | Liou | ............... H01L 29/6681 |
| 2006/0099781 A1 | 5/2006 | Beavmont et al. | |

(Continued)

FOREIGN PATENT DOCUMENTS

| | | |
|---|---|---|
| CN | 101300663 A | 11/2008 |
| CN | 103199019 A | 7/2013 |

(Continued)

OTHER PUBLICATIONS

Office Action from Japanese Patent Application No. 2016-527361, dated Jun. 30, 2017 7 pages (including translation).
(Continued)

*Primary Examiner* — Thao P Le
(74) *Attorney, Agent, or Firm* — Schwabe, Williamson & Wyatt, P.C.

(57) ABSTRACT

Techniques are disclosed for forming a GaN transistor on a semiconductor substrate. An insulating layer forms on top of a semiconductor substrate. A trench, filled with a trench material comprising a III-V semiconductor material, forms through the insulating layer and extends into the semiconductor substrate. A channel structure, containing III-V material having a defect density lower than the trench material, forms directly on top of the insulating layer and adjacent to the trench. A source and drain form on opposite sides of the channel structure, and a gate forms on the channel structure. The semiconductor substrate forms a plane upon which both GaN transistors and other transistors can form.

11 Claims, 8 Drawing Sheets

Related U.S. Application Data continuation of application No. 15/036,780, filed as application No. PCT/US2013/077621 on Dec. 23, 2013, now Pat. No. 9,660,085.

(51) Int. Cl.

| H01L 29/20 | (2006.01) |
|---|---|
| H01L 29/10 | (2006.01) |
| H01L 29/205 | (2006.01) |
| H01L 21/762 | (2006.01) |
| H01L 21/306 | (2006.01) |
| H01L 21/02 | (2006.01) |
| H01L 29/66 | (2006.01) |
| H01L 29/08 | (2006.01) |
| H01L 27/06 | (2006.01) |
| H01L 27/12 | (2006.01) |
| H01L 29/34 | (2006.01) |
| H01L 21/8234 | (2006.01) |
| H01L 27/088 | (2006.01) |
| H01L 21/8258 | (2006.01) |
| H01L 21/84 | (2006.01) |
| H01L 27/092 | (2006.01) |

(52) U.S. Cl.
CPC .. *H01L 21/02433* (2013.01); *H01L 21/02458* (2013.01); *H01L 21/02639* (2013.01); *H01L 21/02647* (2013.01); *H01L 21/30604* (2013.01); *H01L 21/30612* (2013.01); *H01L 21/7624* (2013.01); *H01L 21/8258* (2013.01); *H01L 21/823431* (2013.01); *H01L 27/0605* (2013.01); *H01L 27/088* (2013.01); *H01L 27/1211* (2013.01); *H01L 29/0649* (2013.01); *H01L 29/0653* (2013.01); *H01L 29/0847* (2013.01); *H01L 29/1033* (2013.01); *H01L 29/2003* (2013.01); *H01L 29/205* (2013.01); *H01L 29/34* (2013.01); *H01L 29/66462* (2013.01); *H01L 29/66522* (2013.01); *H01L 29/66636* (2013.01); *H01L 29/66659* (2013.01); *H01L 21/76224* (2013.01); *H01L 21/845* (2013.01); *H01L 27/0922* (2013.01)

(56) References Cited

U.S. PATENT DOCUMENTS

| 2007/0166901 | A1 | 7/2007 | Lee |
|---|---|---|---|
| 2007/0281446 | A1 | 12/2007 | Winstead et al. |
| 2009/0261363 | A1 | 10/2009 | Chen |
| 2009/0267114 | A1 | 10/2009 | Nakayama |
| 2010/0019248 | A1 | 1/2010 | Therrien |
| 2010/0102400 | A1 | 4/2010 | Sell |
| 2011/0006343 | A1 | 1/2011 | Hata et al. |
| 2011/0147798 | A1 | 6/2011 | Radosavljevic |
| 2011/0223736 | A1 | 9/2011 | Lin et al. |
| 2012/0056244 | A1 | 3/2012 | Bahl |
| 2012/0305992 | A1 | 12/2012 | Marino et al. |
| 2013/0015498 | A1 | 1/2013 | Briere |
| 2013/0112939 | A1 | 5/2013 | Chi-Ming et al. |
| 2013/0200443 | A1 | 8/2013 | Lavoie et al. |
| 2013/0240348 | A1 | 9/2013 | Mi |
| 2013/0299895 | A1 | 11/2013 | Oxland et al. |
| 2016/0204207 | A1 | 7/2016 | Then |
| 2017/0117365 | A1 | 4/2017 | Bu |
| 2017/0236936 | A1* | 8/2017 | Then ................... H01L 29/7848 257/76 |
| 2017/0256457 | A1* | 9/2017 | Deng .................. H01L 21/0332 |
| 2018/0337281 | A1* | 11/2018 | Mihara ............... H01L 29/7851 |
| 2019/0019891 | A1* | 1/2019 | Glass .................. H01L 29/6681 |
| 2019/0157161 | A1* | 5/2019 | Balakrishnan ...... H01L 29/1066 |
| 2019/0181220 | A1* | 6/2019 | Cheng .................. H01L 29/107 |

FOREIGN PATENT DOCUMENTS

| JP | H08-078692 | 3/1996 |
|---|---|---|
| JP | 2001-230410 | 8/2001 |
| JP | 2004-055943 | 2/2004 |
| JP | 2006-173241 | 6/2006 |
| JP | 2006-216671 | 8/2006 |
| JP | 2010-226081 | 12/2006 |
| JP | 2008-159691 | 7/2008 |
| JP | 2008-546181 | 12/2008 |
| JP | 2009-016655 | 1/2009 |
| JP | 2010-114112 | 5/2010 |
| JP | 2011-082526 | 4/2011 |
| JP | 2011-159795 | 8/2011 |
| JP | 2013-045829 | 3/2013 |
| JP | 2013-098559 | 5/2013 |
| WO | WO 2006125040 | 11/2006 |
| WO | WO 2008/099901 | 8/2008 |

OTHER PUBLICATIONS

Notice of Allowance from Taiwan Patent Application No. 103140477, dated Sep. 30, 2016, 2 pages.
Search Report from European Patent Application No. 13900386.7, dated Jun. 27, 2017, 8 pages.
Office Action including Search Report from the Examiner of Intellectual Property Office (the IPO) dated Jul. 7, 2016 for Taiwan Patent Application No. 103140477 and English Translation thereof.
Notification of Transmittal of the International Search Report and the Written Opinion of the International Searching Authority for PCT/US2013/077621 filed Dec. 23, 2013 dated Oct. 15, 2014, 14 pages.
Notification of Transmittal of the International Preliminary Report on Patentability of the International Searching Authority for PCT/US2013/077621 filed Dec. 24, 2013 dated Jul. 7, 2016, 10 pages.
Notice of Allowance for Japanese Patent Application No. JP 2016-527361, dated Feb. 27, 2018, 2 pgs.
Office Action for Chinese Patent Application No. 201380081129.3, dated Aug. 27, 2018, 12 pgs.
Office Action from Chinese Patent Application No. 201380081129.3, dated May 8, 2019, 11 pages.
Notice of Allowance from Chinese Patent Application No. 201380081129.3, dated Nov. 25, 2019, 11 pages.

* cited by examiner

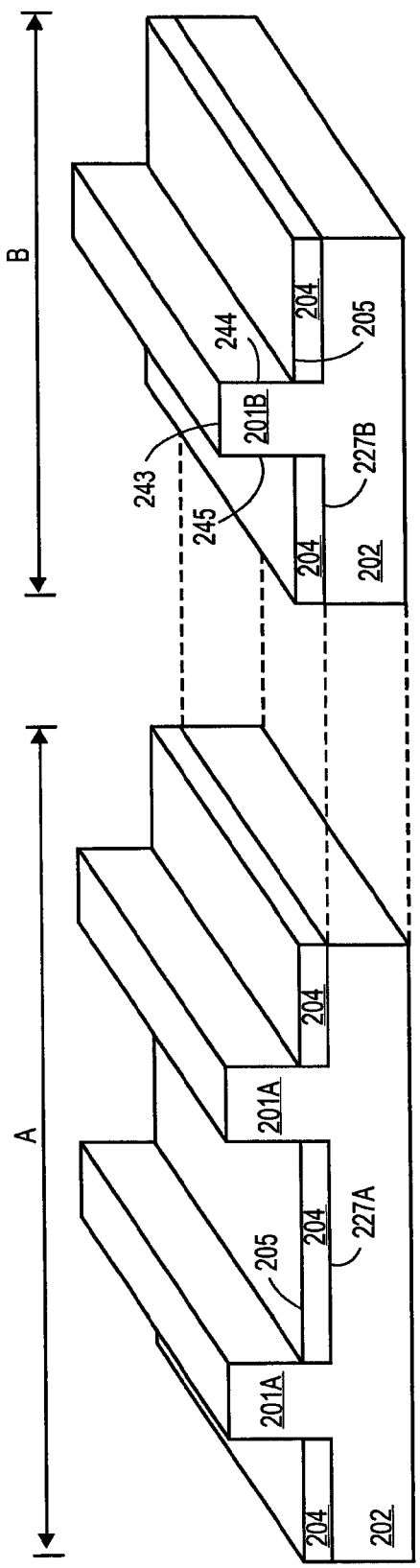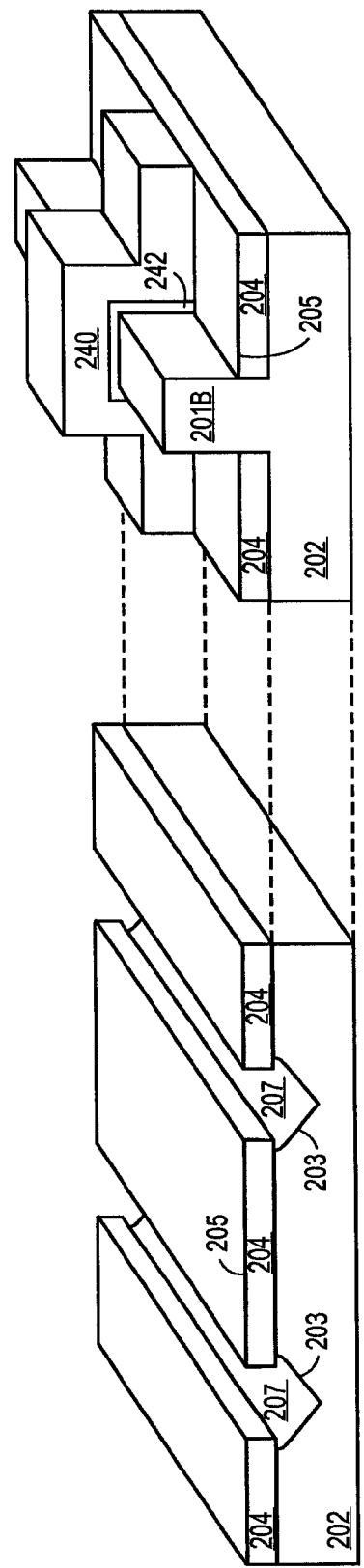
FIG. 2C
FIG. 2D

WIDE BAND GAP TRANSISTORS ON NON-NATIVE SEMICONDUCTOR SUBSTRATES

This is a Continuation of application Ser. No. 15/499,794 filed Apr. 27, 2017 which is a Continuation of application Ser. No. 15/036,780 filed May 13, 2016 now U.S. Pat. No. 9,660,085 issued May 23, 2017, which is a U.S. National Phase Application under 35 U.S.C. 371 of International Application No. PCT/US2013/077621 filed Dec. 23, 2013, which are incorporated hereby reference.

TECHNICAL FIELD

Embodiments of the present invention relate generally to wide band gap transistors on semiconductor substrates and their methods of fabrication. More particularly, embodiments of the present invention relate to gallium nitride transistors on silicon substrates and their methods of fabrication.

BACKGROUND

Power management (PM) and radio frequency (RF) amplification are critical device processes performed in the operation of modem mobile computing platforms, such as smartphones, tablets, and laptop/notebooks. Integrated circuits (IC) contained in System-on-Chip products and designed to perform these operations, such as power management integrated circuits (PMIC) and radio frequency integrated circuits (RFIC), require transistors that can withstand high voltages and electric fields. Typical voltages encountered by PMICs and RFICs that perform high-voltage switching for DC-to-DC conversion in the output filter as well as in the drive circuitries, for example, can be as much as 3.7 V as outputted by ordinary lithium batteries. Using silicon transistors to perform at these high voltages, however, proves difficult due to the low band gap of silicon (i.e., 1.12 eV). For instance, in order for a silicon transistor in a silicon-based PMIC to withstand voltages of 3.7 V, the transistor size will need to be in the dimension of tens of millimeters. In an alternative solution, silicon transistors in a PMIC can be formed in series. However, such configurations have significant power losses and high resistances, which lead to short battery life and cooling issues. As a result, current solutions utilize alternative semiconductor materials with wider band gaps. One such material is gallium nitride (GaN).

GaN is a wide band gap (i.e., 3.4 eV) semiconductor material that has been widely explored for its beneficial properties relating to micro-electronic devices including, but not limited to, transistors, light emitting diodes (LED), and high-power integrated circuits. GaN has a wurtzite crystalline structure with a lattice constant that is smaller than the lattice constant of silicon, and has an electron mobility similar to that of silicon, which is approximately 1300 $cm^2(v \cdot s)^{-1}$.

Currently, GaN is grown heteroepitaxially on non-GaN substrates by brute force (e.g., direct growth of epitaxial GaN on non-GaN substrates). Brute force growth of GaN on non-native substrates results in substantial lattice mismatch between the substrate and the epitaxial layer caused by the difference in their lattice structures and/or lattice constants. Lattice mismatch between a non-GaN substrate and a GaN epitaxial layer causes threading dislocation defects to propagate in all directions from the interface between the GaN epitaxial layer and non-GaN substrate.

In an effort to decrease the amount of these defects, conventional solutions grow a thick buffer layer (e.g., greater than 1 μm) of GaN on a non-native substrate (e.g., silicon, sapphire, or silicon carbide) in hopes that a number of threading dislocations will cease to occur somewhere in the middle of growth. Even with several microns of buffer GaN growth, however, the defect density of resulting GaN cannot achieve a defect density less than 2E7 $cm^{-2}$. Furthermore, the buffer layer creates a large height difference between GaN transistors formed on top of the buffer layer and other transistors formed on the silicon substrate, such as complementary metal oxide semiconductors (CMOS). As a result, this height difference precludes direct heterogeneous integration of GaN transistors on silicon substrates for co-integration with silicon CMOS transistors on the same substrate plane.

BRIEF DESCRIPTION OF THE DRAWINGS

FIGS. 2A-2K illustrate isometric views of a method of forming a wide band gap transistor co-integrated with a silicon-based finFET transistor on a silicon substrate, in accordance with an embodiment of the invention.

DETAILED DESCRIPTION

Wide band gap transistors formed on non-native semiconductor substrates and their methods of fabrication are disclosed. Embodiments of the present invention are described with respect to specific details in order to provide a thorough understanding of the invention. One of ordinary skill in the art will appreciate that embodiments of the invention can be practiced without these specific details. In other instances, well known semiconductor processes and equipment are not described in specific detail in order to not unnecessarily obscure embodiments of the present invention. Additionally, the various embodiments shown in the figures are illustrative representations and are not necessarily drawn to scale.

Embodiments of the invention are directed to wide band gap transistors formed on semiconductor substrates. Wide band gap transistors are formed by lateral epitaxial overgrowth (LEO) from an adjacent trench. Using LEO to form a channel structure for a wide band gap transistor precludes the need for a large buffer layer. In embodiments, the wide band gap transistors are co-integrated with silicon transistors on the same wafer plane of a monocrystalline silicon substrate.

In one embodiment of the invention, a monocrystalline silicon substrate is provided. The silicon substrate includes a top silicon dioxide insulating layer. A channel structure is formed directly on top of the top silicon dioxide insulating layer of the silicon substrate. The channel structure is composed of a wide band gap semiconductor material. A gate electrode, a gate dielectric, and optional gate spacers are formed on top of the channel structure. Disposed directly adjacent to the channel structure are a source and a drain. The source and drain are disposed on opposite sides of the channel structure. Directly below the source is a trench that extends from a top surface of the silicon substrate, through the silicon dioxide insulating layer, and into the silicon substrate. Accordingly, the channel structure is adjacent to the trench. The trench contains a trench material composed of a defective wide band gap semiconductor material. The trench material and the channel structure are composed of the same semiconductor material. However, the channel structure has significantly less defects than the trench material. The trench material is thermally coupled with the source, thus providing a direct heat sink to the substrate. Forming the channel structure directly on top of the silicon dioxide insulating layer allows the wide band gap transistor to be co-integrated with a transistor on the same semiconductor substrate.

Figure 1:
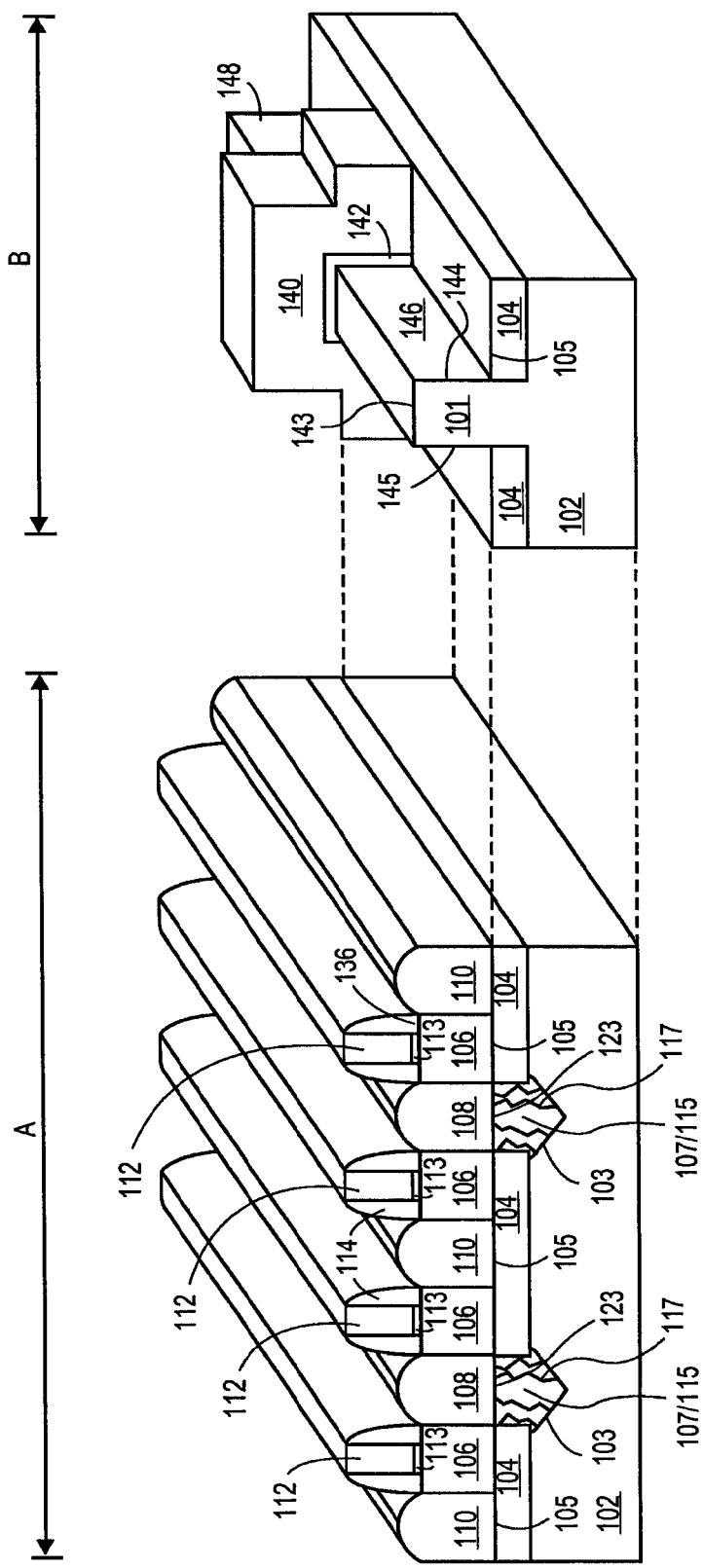
FIG. 1 illustrates an isometric view of a wide band gap transistor co-integrated with a silicon-based finFET transistor on a silicon substrate, in accordance with an embodiment of the invention.

FIG. 1 illustrates an isometric view of a wide band gap transistor co-integrated with a finFET transistor on a silicon semiconductor substrate 102 in accordance with an embodiment of the present invention. Parts of the wide band gap transistor and finFET device, such as first contacts (e.g., source and drain contacts) and an interlayer dielectric, are not shown for purposes of clarity. An illustration in region A of FIG. 1 depicts wide band gap transistors formed on a semiconductor substrate 102. Additionally, an illustration in region B of FIG. 1 depicts a finFET transistor formed on the semiconductor substrate 102 in the same wafer plane as the wide band gap transistors. As shown in FIG. 1, the wide band gap and finFET transistors are co-integrated with one another. That is, the wide band gap transistor and the finFET transistor are formed side-by-side within the same wafer plane. The dotted lines in between the two structures indicate that the finFET transistor is formed on the same wafer plane as the wide band gap transistor regardless of whether the wide band gap transistor is adjacent to or far away from the finFET transistor.

Semiconductor substrate 102 may be composed of any suitable substrate for semiconductor device fabrication, such as a bulk monocrystalline silicon substrate. The semiconductor substrate 102 includes a dielectric layer 104 formed on a top surface of the semiconductor substrate 102. As such, the dielectric layer 104 electrically isolates the semiconductor substrate 102. Any suitable dielectric material, such as silicon dioxide, may be used to form the dielectric layer 104.

As depicted in region A of FIG. 1, a channel structure 106 is disposed on the dielectric layer 104 of the silicon substrate 102. The channel structure 106 is composed of a wide band gap semiconductor material. In some embodiments, the channel structure 106 is composed of a semiconductor material with a band gap greater than 2.0 eV. In other embodiments, the channel structure is composed of a III-V material. In one particular embodiment, the channel structure 106 is composed of GaN. The dielectric layer 104 electrically isolates the channel structure 106 from the silicon substrate 102. Electrically isolating the channel structure 106 from the substrate 102 advantageously reduces transistor body leakage and parasitic capacitance. Furthermore, using a silicon substrate 102 with a dielectric layer 104 advantageously precludes the need for an expensive silicon-on-insulator (SOI) substrate.

The channel structure 106 may have a small amount of defects within its crystalline structure. Defects within the crystalline structure of the channel structure 106 increase channel resistance when the wide band gap transistor is turned ON. The increased channel resistance causes the transistor to operate inefficiently. As such, a channel structure 106 with a low defect density is desired. In one particular embodiment, the defect density of the channel structure 106 is lower than $1E9\ cm^{-2}$ due to the use of lateral epitaxial overgrowth (LEO). In an alternative embodiment, the defect density of the channel structure 106 is lower than $2E7\ cm^{-2}$.

Disposed directly adjacent and on opposite sides of the channel structure 106 are a source 108 and a drain 110. The source and drain 108 and 110 are composed of any suitable semiconductor material that can be epitaxially grown from the channel structure 106. For instance, a suitable semiconductor material is an alloy of the channel structure 106. In an embodiment, the source and drain regions 108 and 110 are composed of a material that has a band gap narrower than the channel structure 106. As such, the contact resistance between the source and drain 108 and 110 and a first contact can be minimized. In one particular embodiment, the channel structure 106 is composed of GaN and the source and drain 108 and 110 are composed of indium gallium nitride (InGaN). Indium Nitride has a band gap of 0.9 eV. Thus, when indium is alloyed with GaN, the resulting overall effective band gap of lnGaN is lower than 3.4 eV. Moreover, because InGaN is an alloy of GaN, InGaN can be epitaxially grown from the channel structure 106.

In some embodiments, the drain 110 is formed directly on the top surface 105 of the dielectric layer 104. Accordingly, the source 108 is formed directly on a top surface 123 of a trench material 115 formed within a trench 107. As such, the trench material 115 is also adjacent to the channel structure 106. Forming the source 108 directly on the top surface 123 of the trench material 115 thermally couples the source 108 with the substrate 102. Thermal coupling between the source 108 and the substrate 102 advantageously provides direct heat sinking to the substrate 102. Although the source 108 forms on the trench material 115 in some embodiments, other embodiments may switch the locations of the source and drain 108 and 110 such that the drain 110 is thermally coupled with the substrate 102.

In embodiments, the trench material 115 is composed of the same semiconductor material as the channel structure 106. For example, channel structure 106 and the trench material 115 both comprise a material such as GaN. Although the channel structure 106 and trench material 115 may be composed of the same semiconductor materials, the amount of threading dislocation defects 117 within the channel structure 106 is significantly less than the amount of threading dislocation defects 117 within the trench material 115. For instance, both the channel structure 106 and trench material 115 may be composed of GaN, but the channel structure 106 and has a defect density less than $1E9\ cm^{-2}$ while the trench material 115 has a defect density greater than $1E9\ cm^{-2}$. The channel structure 106 has a defect density lower than the trench material 115 because the existence of defects within the channel structure 106 may decrease transistor efficiency and reliability. Trench material 115 can have significantly more defects than the channel structure 106. Under typical transistor operating conditions, the substrate 102 and the source 108 are equipotential. Accordingly, the trench 115 and the source 108 are also equipotential. Thus, current does not pass through the trench material 115. As such, the high defect density of threading dislocations 117 in the trench material 115 may have little effect on transistor operation. In other embodiments, the trench material 115 is composed of a different semiconductor material than the channel structure 106. For example, the channel structure 106 may be composed of GaN and the trench material 115 may be composed of InGaN.

The trench material 115 may be formed on a top surface 103 of the silicon substrate 102. Any suitable epitaxial growth process may form the trench material 115 on the top surface 103 of the silicon substrate 102. In some embodiments, the top surface 103 of the silicon substrate 102 may be a modified surface to aid in the epitaxial growth of the trench material 115. By way of example, not by way of limitation, the top surface 103 of the silicon substrate 102 may be modified to have a V-groove profile. The V-groove profile has modified top surfaces 103 that expose the <111> plane within a global <100> silicon substrate and converge at a lowest point. Compared to a flat-surface profile, the V-groove profile arranges silicon cubic crystals at the top surface 103 in an orientation that allows for better crystalline matching during epitaxial growth.

A gate electrode 112 forms on the channel structure 106. In some embodiments, the gate electrode 112 is a polysilicon gate electrode. In other embodiments, the gate electrode 112 is a metal gate electrode. A dielectric layer 113 is disposed in between the gate electrode 112 and the channel structure 106. In addition, a pair of gate spacers 114 may optionally be formed on opposite sides of the gate electrode 112.

As depicted in region B of FIG. 1, a semiconductor device, such as a finFET transistor, may be formed on the same wafer plane as a wide band gap transistor. The finFET transistor may be a silicon-based transistor. The finFET transistor is formed on the substrate 102. The substrate 102 includes a dielectric layer 104 located at the top surface 105 of the silicon substrate 102 to electrically isolate the silicon substrate 102. A fin 101 extends through the dielectric layer 104 from the silicon substrate 102 in order to expose the top surface 143 and portions of semiconductor sidewalls 144 and 145 of the fin 101. A gate electrode 140 wraps around the three exposed surfaces of the fin 101. A gate dielectric 142 is disposed in between the fin 101 and the gate electrode 140.

Certain embodiments of the present invention may be fabricated according to the processes described with respect to FIGS. 2A-2K. FIGS. 2A-2D depict a wide band gap transistor region A and a finFET transistor region B as the processes are performed. FIGS. 2E-2K depict only the wide band gap transistor region A as the processes continue to be performed.

Figure 2A:
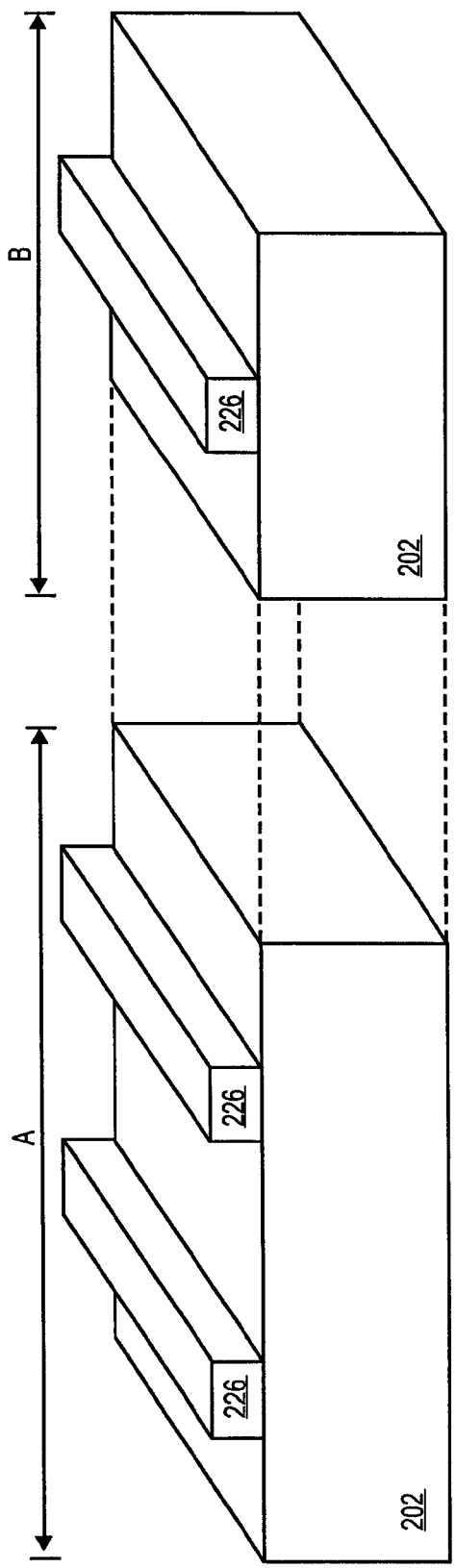

In FIG. 2A, a semiconductor substrate 202 with a patterned photoresist mask 226 is provided. The semiconductor substrate 202 can be composed of a material suitable for semiconductor device fabrication. In one embodiment, the semiconductor substrate 202 is a monocrystalline semiconductor substrate. Semiconductor substrate 202 may also be, but not limited to, silicon (Si), sapphire ($Al_2O_3$), silicon carbide (SiC), gallium arsenide (GaAs), and gallium phosphide (GaP). In one particular embodiment, the substrate is a global <100> oriented monocrystalline silicon substrate. The photoresist mask 226 may be patterned on the semiconductor substrate 202 to allow uncovered areas of the semiconductor substrate 202 to be etched away. In addition to the photoresist mask 226, an intervening hard mask may first be patterned to better resist mask degradation during the etching away of the semiconductor substrate 202. In an embodiment, the photoresist mask 226 is patterned in the finFET transistor region B to define locations where fins for finFET transistors are to be formed. In another embodiment, the photoresist mask 226 is patterned in the wide band gap transistor region A to define locations where trenches are to be formed and where wide band gap semiconductor material is to be subsequently grown.

Figure 2B:
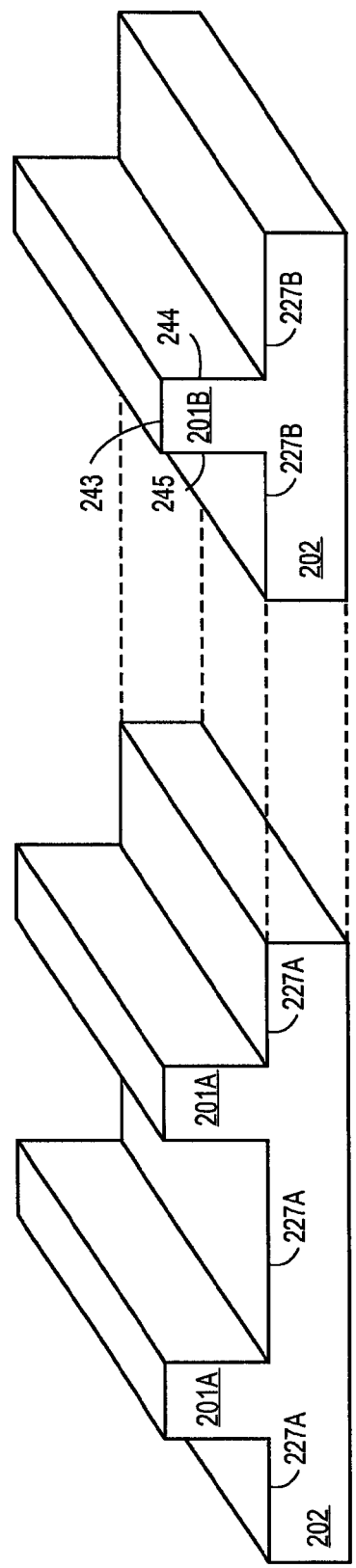

Next, in FIG. 2B, fins 201 are formed by etching away the uncovered areas of the semiconductor substrate 202. A bottom surface 227 lies in between the fins 201. Each fin 201 has a top surface 243 and a first and second semiconductor sidewall 244 and 245. Fins 201A and bottom surfaces 227A are formed in the wide band gap transistor region A, whereas fins 201B and bottom surfaces 227B are formed in the finFET transistor region B. Although three fins 201 are shown in FIG. 2B, it is noted that many more fins 201 may be formed according to additional embodiments of the invention. The fins 201 may be substantially rectangular, but other embodiments are not so limited. The fins 201 can be formed by any suitable anisotropic etch process, such as a plasma etch process using a $Cl_2$-based process gas mixture. The photoresist mask 226 may be removed during the formation of fins 201. In some embodiments, fins 201A and 201B are formed simultaneously with one etch process. As such, the fins 201A and 201B may be substantially similar to one another in both shape and size. In alternative embodiments, fins 201A and 201B are formed separately with at least two different etch processes. As such, the bottom surfaces 227A may be deeper than the bottom surfaces 227B to compensate for a wide band gap transistor device height.

As shown in FIG. 2C, a shallow trench isolation (STI) layer 204 is then formed on the bottom surface 227 located on either side of the fins 201. The STI layer 204 may be any suitable dielectric material, such as silicon dioxide. To form the STI layer 204, one deposition process may simultaneously blanket deposit the dielectric material in the wide band gap transistor region A and the finFET region B. Any well-known deposition process may blanket deposit the dielectric material, such as, but not limited to, chemical vapor deposition (CVD) or plasma-enhanced chemical vapor deposition (PECVD). After blanket depositing the dielectric material, the dielectric material may be planarized and subsequently recessed to form the STI layer 204. Any suitable planarization process, such as a chemical-mechanical polishing (CMP) process, may be used to planarize the dielectric material and any suitable etching process, such as an HF wet etch process, may be used to recess the dielectric material to form the STI layer 204. After formation of the STI layer 204, only a portion of the semiconductor sidewalls 244 and 245 are exposed. The STI layer 204 provides an isolating layer that may be used to isolate a gate electrode from the substrate, as well as provide isolation between individual transistors.

Next, in FIG. 2D, the fins 201A in the wide band gap transistor region A are etched selective to the STI layer 204. Any suitable etch process that etches silicon but does not substantially etch silicon dioxide may be used to remove the fins 201A. Trenches 207 form within the semiconductor substrate 202 after performing the selective etch process. The trenches 207 extend through the STI layer 204 and into the semiconductor substrate 202 to expose top surfaces 203 of the semiconductor substrate 202. As depicted in FIG. 2D, an additional etch process may form a modified top surface 203 of the semiconductor substrate 202. The modified top surface 203 may include a V-groove profile that is formed by any typical crystallographic etch process. In one embodiment, the modified top surface 203 is formed by a wet etch process with an active solution such as, but not limited to, potassium hydroxide (KOH) or tetramethyl ammonium hydroxide (TMAH).

While some embodiments use fins 201A to form the STI layer 204 in the wide band gap region A, alternative embodiments may use a deposition, polish, and etching technique instead. For example, a dielectric material may initially be blanket deposited on the semiconductor substrate 202. Thereafter, the deposited dielectric material may be planarized to form a dielectric layer. Subsequently, areas of the dielectric layer where the trench 207 is to be formed may be etched to reveal the semiconductor substrate 202. As a result, a patterned STI layer 204 is formed. It is to be appreciated that any other method of forming a patterned dielectric layer may be envisioned by embodiments of the present invention.

Although the fins 201A in the wide band gap transistor region A are selectively etched away, the fins 201B in the finFET transistor region B may remain as part of a finFET transistor structure. In one embodiment, the finFET transistor is part of a CMOS circuit. A gate dielectric 242 is disposed on a portion of exposed surfaces of the fin 201B. A gate electrode 240 is formed directly on top of the gate dielectric 242. As such, the gate dielectric 242 is disposed in between the gate electrode 240 and the fin 201B. Any well-known deposition and etch processes may be used to form the gate dielectric 242 and gate electrode 240. Although shown as a complete structure in FIG. 2D, the finFET transistor in region B may be formed by processes before, during, or after the formation of the wide band gap transistor in region A. Any well-known processes for forming finFET transistors may be used to form the finFET transistor in region B.

Figure 2E:
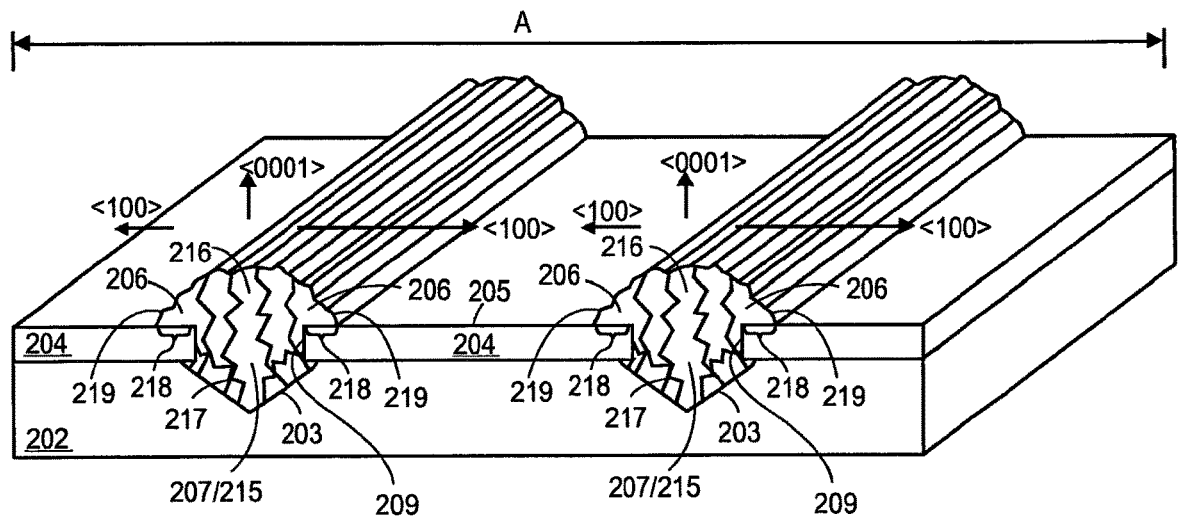

Next, in FIG. 2E, a semiconductor material 216 is epitaxially grown from the top surface 203 of the semiconductor substrate 202 by any suitable epitaxial growth process, such as vapor-phase epitaxy (VPE), molecular beam epitaxy (MBE), or chemical vapor deposition (CVD). In an embodiment, the semiconductor material 216 is composed of a wide band gap material (e.g., any material with a band gap greater than 2.0 eV), a III-V material, or any material that suffers from dislocations and stacking faults in its crystal structure during epitaxial growth on a non-native substrate. In one embodiment, the semiconductor material 216 is GaN. In one particular embodiment, the semiconductor material 216 is GaN and the non-native substrate 202 is silicon.

Semiconductor material 216 initially epitaxially grows within the confined boundaries of the trench 207 forming a trench material 215. Accordingly, semiconductor material 216 cannot grow laterally. As such, semiconductor material 216 grows substantially vertically (i.e., in the <0001> direction) within the trench 207. Threading dislocation defects 217 may form in the semiconductor material 216 during epitaxial growth. These defects are caused by a lattice mismatch between the semiconductor material 216 and the non-native substrate 202. A non-native substrate is any substrate that has a mismatching lattice structure and/or a mismatching lattice constant with the semiconductor material epitaxially grown from it. Threading dislocation defects 217 originate from the top surface 203 of the semiconductor substrate 202 and propagate through the semiconductor material 216 predominantly in the vertical direction. Horizontally and diagonally propagating threading dislocation defects terminate against the sidewall 209 of the trench 207. As such, very few horizontally and diagonally propagating threading dislocation defects continue to propagate above the top surface 205 of the semiconductor substrate 202. Rather, only vertically propagating defects continue to propagate above the top surface 205. In embodiments, the defect density of the trench material 215 is greater than 1E9 cm$^{-2}$.

The modified V-groove profile of the top surface 203 of the substrate 202 aids in the epitaxial growth of semiconductor material 216. Compared to a flat <100> surface profile, the V-groove profile arranges silicon cubic crystals at the top surface 103 in an orientation that allows for better crystalline matching with GaN wurtzite crystals during epitaxial growth. Better crystalline matching advantageously reduces the negative effects of lattice mismatch between the two crystalline structures. In one embodiment, the V-groove profile decreases lattice mismatch to 17% from 41% as seen in growth on a flat <100> surface profile.

When the semiconductor material 216 grows above the top surface 205 of the STI layer 204, the semiconductor material 216 grows laterally (i.e., in the <100> direction) onto the top surface 205 by lateral epitaxial overgrowth (LEO). Laterally grown semiconductor material 206 may have very little threading dislocation defects 217 because most of the defects 217 that propagate horizontally and diagonally have already terminated into the sidewall 209 of the trench 207. As such, the laterally grown semiconductor material 206 disposed on the top surface 205 of the STI layer 204 is substantially high-quality material that is significantly free of defects ("defect-free"). In one embodiment, the defect density of the defect-free laterally grown semiconductor material 206 is less than 1E9 cm$^{-2}$. In an alternative embodiment, the defect density of the defect-free laterally grown semiconductor material 206 is less than 2E7 cm$^{-2}$.

Laterally grown semiconductor material 206 extends a distance 218 over the top surface 205 at one point in its LEO. As laterally grown semiconductor material 206 continues to LEO, side surfaces 219 propagate in the <100> direction and extend toward an adjacent laterally growing semiconductor material 206 until the side surfaces 219 of adjacent semiconductor material coalesce and form a blanket layer of semiconductor material 216 and 206.

Figure 2F:
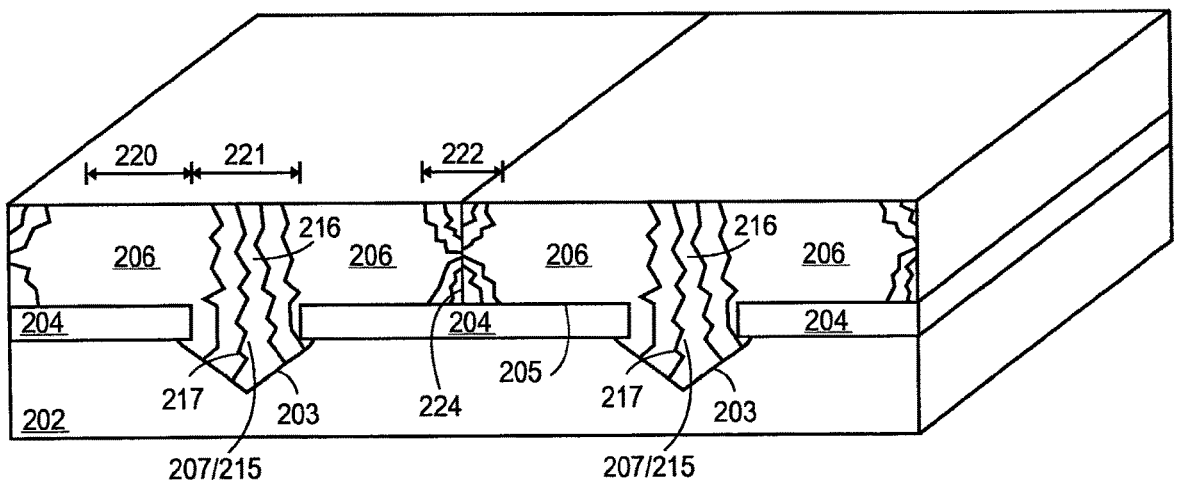

Referring now to FIG. 2F, a seam 224 is formed at the point where two side surfaces 219 of adjacent semiconductor material coalesce. The pressure exerted at the seam 224 from adjacent laterally overflowing materials results in defects formed in the area 222 around the seam 224. As such, the blanket layer of semiconductor material 216 and 206 contains defective areas 221 and 222 and defect-free areas 220. In some embodiments, the defect density of semiconductor material 216 in the defective areas 221 and 222 is greater than 1E9 cm$^{-2}$, whereas the defect density of the defect-free semiconductor material 206 in the defect-free areas 220 is less than 1E9 cm$^{-2}$. Accordingly, the defect-free semiconductor 206 has a significantly lower defect density than the trench material 215. After forming a blanket layer of semiconductor material 216 and 206, the blanket layer of semiconductor material 216 and 206 is subsequently planarized. Any suitable planarizing process, such as CMP may be performed to planarize the blanket layer of semiconductor material 216 and 206 if desired.

Figure 2G:
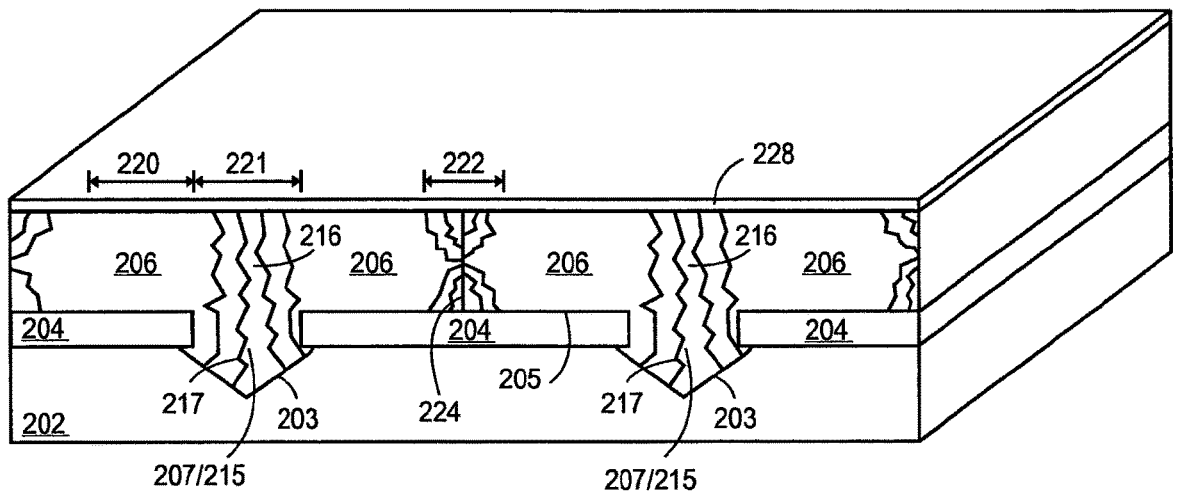

As shown in FIG. 2G, an insulating layer 228 is formed directly on top of the blanket layer of semiconductor material 216 and 206. The insulating layer 228 may be composed of any suitable dielectric such as silicon dioxide. Any well-known deposition technique may be used to form the insulating layer 228. The insulating layer 228 isolates the top surface of blanket layer of semiconductor material 216 and 206 from exposure to subsequent process conditions.

Figure 2H:
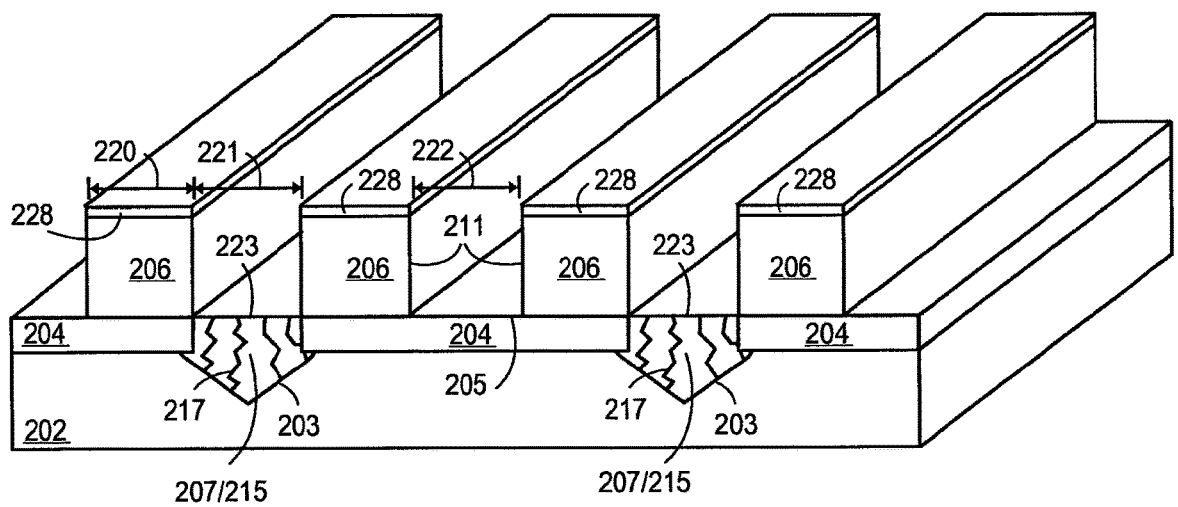

Next, as illustrated in FIG. 2H, the defective portions of the blanket layer of semiconductor material 216 and 206 in areas 221 and 222 are etched to form channel structures 206 and trenches 207 containing the trench material 215. As a result, the top surface 205 of the STI layer 204, side surfaces 211 of the channel structures 206, as well was top surfaces 223 of the trench material 215 are exposed. The top surfaces 223 of the trench material 215 and the side surfaces 211 of the channel structures 206 may provide nucleation surfaces for subsequent epitaxial growth of semiconductor material. In some embodiments, the top surface 223 of the trench material 215 is substantially coplanar with the top surface 205 of the STI layer 204 as depicted in FIG. 2H. In alternative embodiments, however, the top surface 223 of the trench material 215 is not substantially coplanar with the top surface 205 of the STI layer 204. As such, the top surface 223 of the trench material 215 may be lower or higher than the top surface 205 of the STI layer 204. In an embodiment where the top surface 223 of the trench material 215 is higher than the top surface 205 of the STI layer 204, the trench material 215 is directly adjacent to the channel structure 206. In an alternative embodiment where the top surface 223 of the trench material 215 is lower than the top surface 205 of the STI layer 204, the trench 207 contains a semiconductor material different from the trench material 215. For example, the trench material 215 composed of GaN may be etched out of the trench 207 and subsequently filled with InGaN. In any case, the semiconductor material in the trench 207 provides a nucleation surface for epitaxial growth of semiconductor material. Any suitable masking and etching process may be used to remove defective portions of the blanket layer 216. In one embodiment, a dry etch process that uses $Cl_2$ plasma is used to remove defective portions of the blanket layer 216 and 206.

Figure 2I:
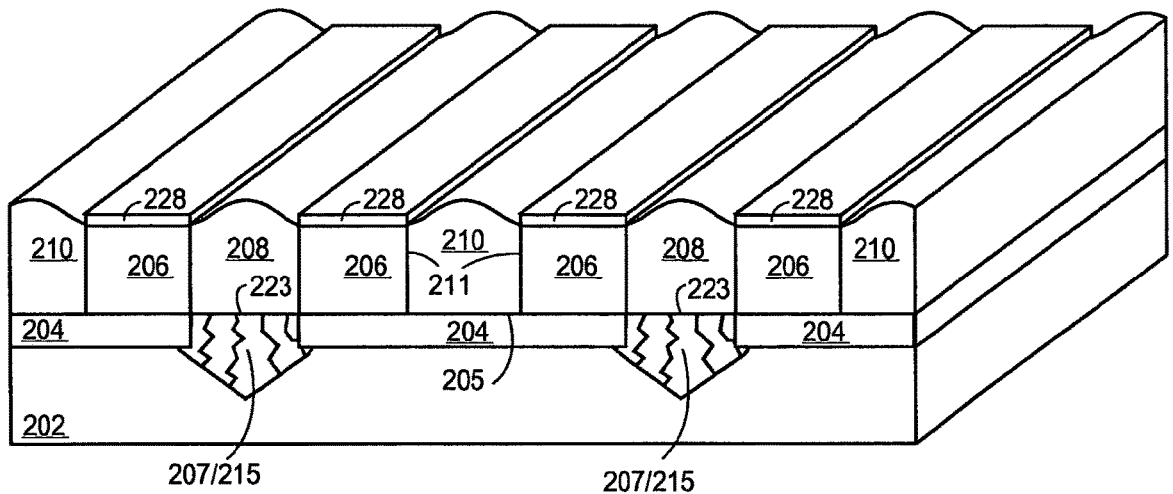

Thereafter, as shown in FIG. 2I, a semiconductor material for a source 208 and a drain 210 is epitaxially grown within the openings formed in the blanket layer 216 and 206. As such, the source 208 and drain 210 may be self-aligned to the channel structure 206. The exposed top surface 223 of the trench material 215 and side surfaces 211 of the channel structure 206 serve as nucleating surfaces from which the source 208 and drain 210 can epitaxially grow. Furthermore, the insulating layer 228 prevents epitaxial growth of semiconductor material from the top of the channel structure 206. As such, the source 208 and drain 210 form on opposite sides of the channel structure 206. The drain 210 may be disposed directly on the top surface 205 of the STI layer 204 and the source 208 may be formed directly on the top surface 223 of the trench material 215 to form a source-in-trench structure. Nucleation of the source 208 on the trench material 215 may thermally couple the source 208 with the substrate 202 via the trench material 215. Direct thermal communication between the source 208 and the substrate 202 may provide direct heat sinking to the substrate 202, advantageously enhancing thermal dissipation during transistor operation. Although the source 208 forms on the trench material 215 in some embodiments, alternative embodiments may invert the locations of the source 208 and drain 210.

The source 208 and drain 210 may be composed of a different semiconductor material than the channel structure 206. Although their semiconductor materials may be different, the lattice structure of the source 208 and drain 210 may be similar to the channel structure 206 such that epitaxial growth is possible. In an embodiment, the source 208 and drain 210 may be composed of a semiconductor material whose overall effective band gap is narrower than the channel structure 206 in order to minimize contact resistance with a first contact (not shown). In an embodiment of the invention, the channel structure 206 is composed of GaN and the source 208 and drain 210 are composed of a GaN alloy, such as InGaN. The source 208 and drain 210 may be formed by any well-known epitaxial growth technique, such as VPE, MBE, and CVD.

According to an embodiment, the narrower band gap of the semiconductor material used to form the source 208 and drain 210 is obtained by increasing the amount of the more conductive element. For instance, in an embodiment, InN is alloyed with GaN to form an InGaN alloy for the source 208 and drain 210. Because InN has a band gap of 0.9 eV, as the amount of In in the InGaN alloy increases, the overall effective band gap of the InGaN decreases. In a particular embodiment, the concentration of In is such that the overall effective band gap of InGaN ranges from 1.5 eV to 3.2 eV. Furthermore, the crystalline structure of InGaN is similar to GaN. As such, the InGaN alloy can be epitaxially grown from the side surfaces 211 of the channel structure 206 comprising GaN while maintaining a narrow band gap for minimizing contact resistance with a first contact (not shown). The source 208 and drain 210 may also be composed of a highly doped $N^+$ semiconductor material in order to further reduce their overall effective band gap. Any suitable $N^+$ dopant, such as silicon, may be introduced during the epitaxial growth of the source 208 and drain 210 to form the highly doped $N^+$ semiconductor material. It is to be appreciated that as silicon dopants increase to concentrations well over 5E19 $cm^{-3}$, the process of forming the source 208 and drain 210 become more akin to blanket deposition than epitaxial growth. As such, one skilled in the art may adjust the dopant concentration to maximize $N^+$ dopant concentration while maintaining epitaxial growth of the source 208 and drain 210. In one embodiment, the doping concentration of the highly doped $N^+$ semiconductor material is as high as 5E19 $cm^{-3}$. In an alternative embodiment, the doping concentration of the highly doped $N^+$ semiconductor material results in a semiconductor material with a sheet resistance of 40 to 50 ohm/sq.

Unlike the channel structure 206, the source 208 and drain 210 merely act as nodes for current flow. As such, the source 208 and drain 210 may not require such low defect densities as the channel structure 206. In embodiments, the source 208 and drain 210 have a defect density greater than 1E9 $cm^{-2}$.

Figure 2J:
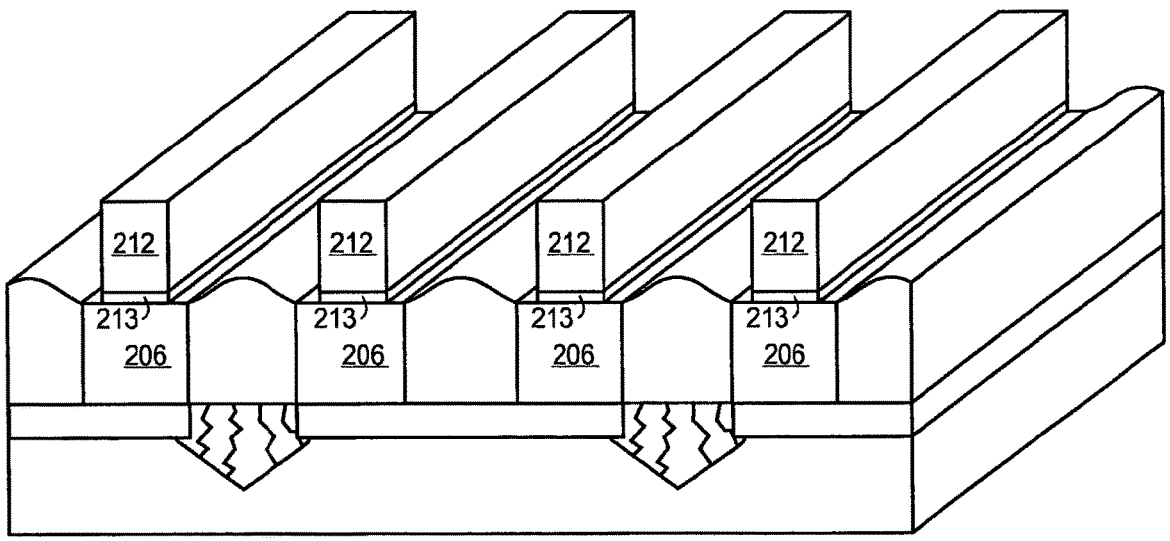

Next, as shown in FIG. 2J, a gate stack including a gate dielectric 213 and a gate electrode 212 is formed on top of the channel structure 206. Any suitable material, such as silicon dioxide, may be used to form the gate dielectric 213. In an embodiment, the insulating layer 228 is used as the gate dielectric 213. In alternative embodiments, the dielectric layer 228 is removed and a gate dielectric 213 is formed. The gate electrode 212 can be composed of any suitable material, such as polysilicon. The gate electrode 212 and the gate dielectric 213 can be formed by any deposition and etch technique well-known in the art.

Figure 2K:
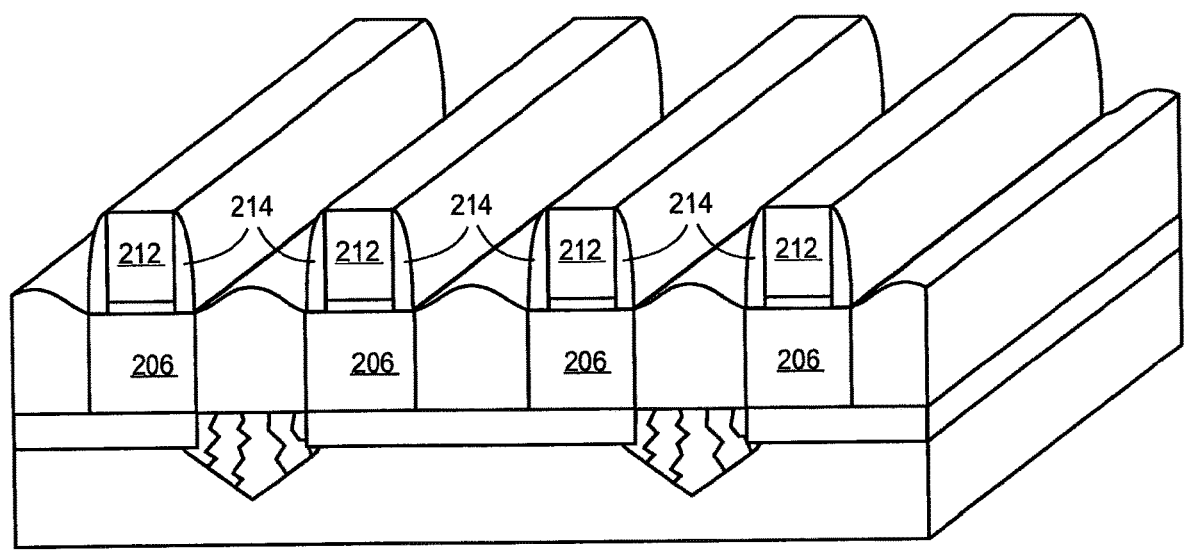

In FIG. 2K, gate spacers 214 may subsequently be formed on opposite sides of the gate stack 212 and 213. The gate spacers 214 may be composed of any suitable spacer material, such as silicon dioxide, silicon nitride, or silicon carbide. Furthermore, any suitable spacer etching process may be used to form the gate spacer 214.

Figure 3:
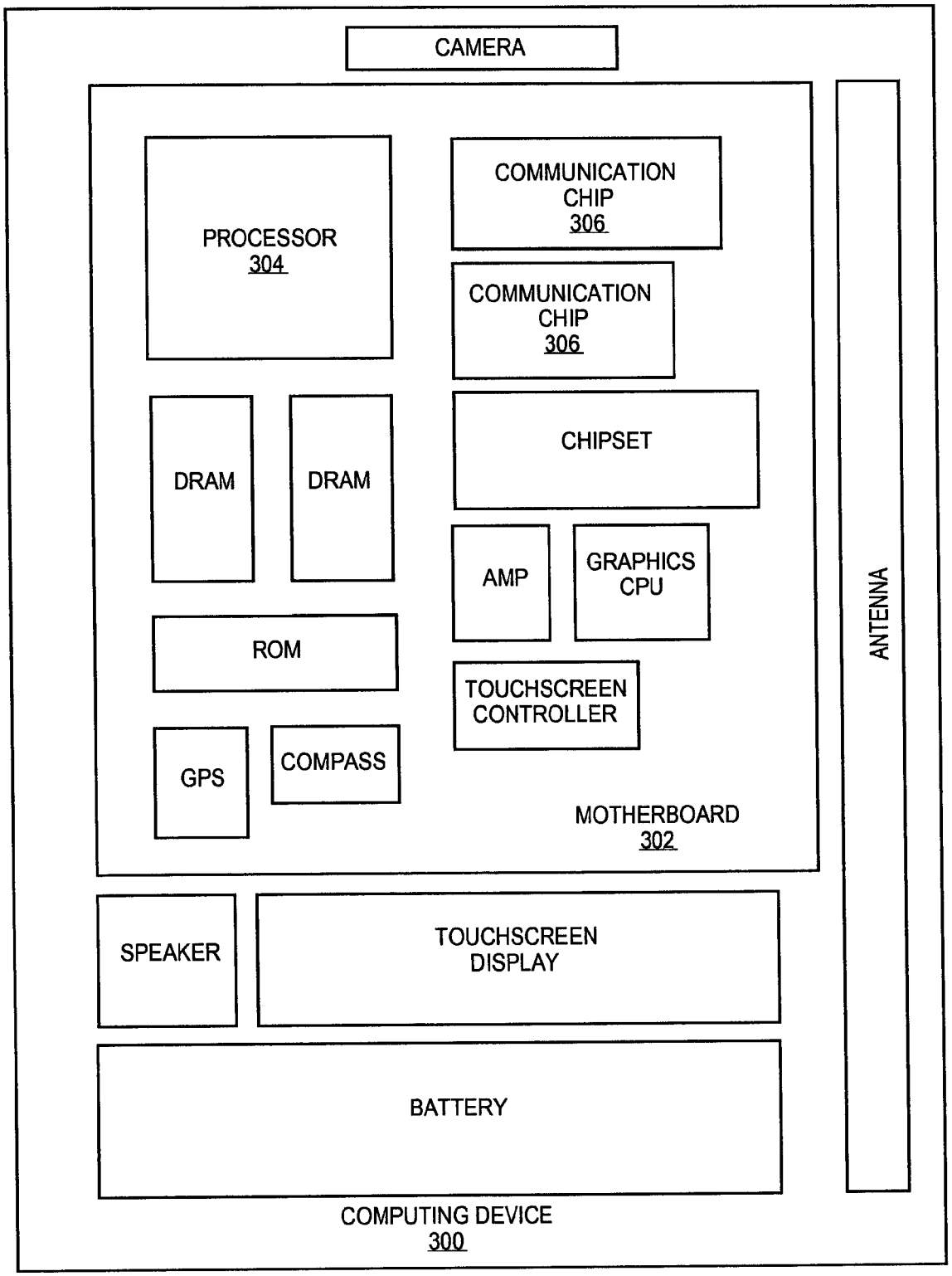
FIG. 3 illustrates a computing system implemented with one implementation of the invention.

FIG. 3 illustrates a computing system 300 implemented with one implementation of the invention. The computing device 300 houses a board 302. The board 302 may include a number of components, including but not limited to a processor 304 and at least one communication chip 306. The processor 304 is physically and electrically coupled to the board 302. In some implementations the at least one communication chip 306 is also physically and electrically coupled to the board 302. In further implementations, the communication chip 306 is part of the processor 304.

Depending on its applications, computing device 300 may include other components that may or may not be physically and electrically coupled to the board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 306 enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

The processor 304 of the computing device 300 includes an integrated circuit die packaged within the processor 304. In some implementations of the invention, the integrated circuit die of the processor includes one or more devices, such as wide band gap transistors formed on non-native semiconductor substrates, that are formed in accordance with implementations of the invention. The term "processor" may refer to any device or portion of a device that processes electronic data from registers and/or memory to transform that electronic data into other electronic data that may be stored in registers and/or memory.

The communication chip 306 also includes an integrated circuit die packaged within the communication chip 306. In accordance with another implementation of the invention, the integrated circuit die of the communication chip includes one or more devices, such as airgap interconnects with hood layers, that are formed in accordance with implementations of the invention.

In further implementations, another component housed within the computing device 300 may contain an integrated circuit die that includes one or more devices, such as airgap interconnects with hood layers, that are formed in accordance with implementations of the invention.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

In an embodiment, a semiconductor transistor structure comprises a semiconductor substrate; an insulating layer formed on top of the silicon substrate; a trench extending through the insulating layer and into the silicon substrate, the trench containing a trench material comprising a first III-V semiconductor material; a channel structure formed directly on top of the insulating layer and adjacent to the trench, the channel structure formed with a channel material comprising a second III-V semiconductor material having a defect density lower than a defect density of the trench material; a source and drain formed on opposite sides of the channel structure, the source formed on top of the trench material; and a gate electrode formed above the channel structure. In another embodiment, the trench material and the channel material comprise gallium nitride. In yet another embodiment, the channel material has a defect density less than 1E9 cm$^{-2}$. In an alternative embodiment, the trench material has a defect density greater than 1E9 cm$^{-2}$. In another embodiment, the source is formed on top of the trench material and the drain is formed on top of the insulating layer. In yet another embodiment, the source is thermally coupled with the trench material. In an alternative embodiment, the source is thermally coupled with the silicon substrate. In one embodiment, the source and drain comprise indium gallium nitride. In one other embodiment, the indium gallium nitride has an N$^+$ doping concentration higher than 5E19 cm$^{-2}$. In yet another embodiment, the semiconductor substrate comprises silicon, the trench material and channel structure comprise GaN, and the source and drain comprise InGaN.

In one embodiment, a method of forming a semiconductor transistor structure comprises forming a patterned insulating layer on a semiconductor substrate, the patterned insulating layer exposing an uncovered portion of the semiconductor substrate; forming a trench in the semiconductor substrate at the uncovered portion of the semiconductor substrate; growing a semiconductor material within the trench such that the material laterally overflows onto the patterned insulating layer and forms a blanket layer, the material comprising a III-V semiconductor material; etching away a portion of the blanket layer such that a channel structure and a trench material remain, the channel structure having a lower defect density than the trench material; forming a source and drain on opposite sides of the channel structure; and forming a gate electrode on top of the channel structure. In an alternative embodiment, the blanket layer is formed by the material coalescing with an adjacent laterally overflowing material. In another embodiment, the forming a trench in the semiconductor substrate is a selective etching of the uncovered portion of the semiconductor substrate. In yet another embodiment, the material comprising a III-V semiconductor material is gallium nitride. In one embodiment, the portion of the blanket layer is a defective portion having a defect density greater than a defect density of the channel structure. In one other embodiment, the defective portion contains a defect density greater than 1E9 cm$^{-2}$. In an alternative embodiment, the defect density of the channel structure is less than 1E9 cm$^{-2}$. In another embodiment, the trench material has a defect density greater than 1E9 cm$^{-2}$. In yet another embodiment, the source and drain are formed by epitaxial growth. In one embodiment, the epitaxial growth forms an indium gallium nitride structure. In one other embodiment, the indium gallium nitride structure is formed with an N$^+$ doping concentration higher than 5E19 cm$^{-2}$.

In an embodiment, a system-on-chip comprises a semiconductor substrate; a metal oxide semiconductor transistor formed on the semiconductor substrate; and a wide band gap semiconductor transistor formed on the semiconductor substrate and adjacent to the metal oxide semiconductor transistor, comprising an insulating layer formed on top of the semiconductor substrate; a trench formed through the insulating layer and extending into the semiconductor substrate, the trench filled with a trench material comprising a III-V semiconductor material; a channel structure formed directly on top of the insulating layer and adjacent to the trench, the channel structure formed with a channel material comprising a III-V semiconductor material having a defect density lower than a defect density of the trench material; a source and drain formed on opposite sides of the channel structure; and a gate electrode formed on top of the channel structure. In an alternative embodiment, the trench material and the channel material comprise gallium nitride. In another embodiment, the channel material has a defect density of less than 1E9 cm$^{-2}$. In yet another embodiment, the trench material has a defect density greater than 1E9 cm$^{-2}$. In one embodiment, the source is formed on top of the trench material and the drain is formed on top of the insulating layer. In one other embodiment, the source is thermally coupled with the trench material. In a different embodiment, the source is thermally coupled with the semiconductor substrate. In another embodiment, the source and drain comprise indium gallium nitride. In yet another embodiment, the indium gallium nitride has an N$^+$ doping concentration higher than 5E19 cm$^{-3}$.

In utilizing the various aspects of this invention, it would become apparent to one skilled in the art that combinations or variations of the above embodiments are possible for forming a wide band gap transistor on a non-native semiconductor substrate. Although embodiments of the present invention have been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating embodiments of the present invention.

What is claimed is:

1. An integrated circuit structure, comprising:
   a silicon substrate;
   an insulating layer formed on top of the silicon substrate;
   a first trench extending through the insulating layer and into the silicon substrate, the first trench containing a trench material comprising a first III-V semiconductor material;
   a channel structure formed directly on top of the insulating layer and adjacent to the trench, the channel structure formed with a channel material comprising a second III-V semiconductor material;
   a first gate electrode formed above the channel structure;
   a second trench in the insulating layer;
   a silicon fin protruding from the silicon substrate and through the second trench, the silicon fin having an upper portion above the insulating layer; and
   a second gate electrode formed over the upper portion of the silicon fin.

2. The integrated circuit structure of claim 1, further comprising:
   a first source and a first drain formed on opposite sides of the channel structure, the first drain formed on top of the trench material; and
   a second source and a second drain formed on opposite sides of the second gate electrode.

3. The integrated circuit structure of claim 1, wherein the second III-V semiconductor material has a defect density lower than a defect density of the trench material.

4. The semiconductor transistor structure of claim 3, wherein the trench material and the channel material comprise gallium nitride.

5. The semiconductor transistor structure of claim 3, wherein the channel material has a defect density less than 1E9 cm-2.

6. The semiconductor transistor structure of claim 5, wherein the trench material has a defect density greater than 1E9 cm-2.

7. The semiconductor transistor structure of claim 2, wherein the first source is formed on top of the insulating layer.

8. The semiconductor transistor structure of claim 1, wherein the first III-V semiconductor material is the same as the second III-V semiconductor material.

9. The semiconductor transistor structure of claim 2, wherein the first source and first drain comprise indium gallium nitride.

10. The semiconductor transistor structure of claim 9, wherein the indium gallium nitride has an N+ doping concentration higher than 5E19 cm-3.

11. The semiconductor transistor structure of claim 2, wherein the trench material and channel structure comprise GaN, and the first source and first drain comprise InGaN.

* * * * *